United States Patent
Kuo et al.

(10) Patent No.: US 9,431,360 B2
(45) Date of Patent: Aug. 30, 2016

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Hsuan-Ting Kuo, Taichung (TW); Yu-Peng Tsai, Taipei (TW); Wei-Hung Lin, Hsinchu County (TW); Chun-Lung Jao, Nantou County (TW); Chao-Wen Shih, Hsinchu County (TW); Ming-Da Cheng, Hsinchu Country (TW); Chung-Shi Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/287,389

(22) Filed: May 27, 2014

(65) Prior Publication Data

US 2015/0348927 A1 Dec. 3, 2015

(51) Int. Cl.
| | | |
|---|---|---|
| *H01L 23/48* | (2006.01) | |
| *H01L 23/00* | (2006.01) | |
| *H01L 21/78* | (2006.01) | |
| *H01L 21/56* | (2006.01) | |
| *H01L 23/544* | (2006.01) | |
| *H01L 23/31* | (2006.01) | |

(52) U.S. Cl.
CPC ............. *H01L 24/14* (2013.01); *H01L 21/561* (2013.01); *H01L 21/78* (2013.01); *H01L 23/3114* (2013.01); *H01L 23/544* (2013.01); *H01L 24/11* (2013.01); *H01L 24/94* (2013.01); *H01L 2223/54426* (2013.01); *H01L 2223/54453* (2013.01); *H01L 2224/11334* (2013.01); *H01L 2224/13022* (2013.01); *H01L 2224/94* (2013.01); *H01L 2924/182* (2013.01); *H01L 2924/186* (2013.01); *H01L 2924/1815* (2013.01); *H01L 2924/206* (2013.01); *H01L 2924/20656* (2013.01); *H01L 2924/20657* (2013.01); *H01L 2924/20658* (2013.01)

(58) Field of Classification Search
CPC ..... H01L 21/78; H01L 21/56; H01L 21/563; H01L 23/3114; H01L 24/05; H01L 24/02; H01L 24/13; H01L 24/11; H01L 21/05; H01L 23/544; H01L 23/3107; H01L 23/293; H01L 23/31; H01L 24/14; H01L 24/94; H01L 2223/54426; H01L 2223/54453; H01L 2224/11334; H01L 2224/13022; H01L 2224/1815; H01L 2224/182; H01L 2224/186; H01L 2224/206; H01L 2224/20656; H01L 2224/20657; H01L 2224/20658
USPC .......................................... 257/295; 438/113
See application file for complete search history.

(56) References Cited

U.S. PATENT DOCUMENTS

2004/0258913 A1* 12/2004 Lu ....................... G02B 6/12002
428/375
2009/0102070 A1* 4/2009 Feger ..................... H01L 21/563
257/797

(Continued)

*Primary Examiner* — Vongsavanh Sengdara
(74) *Attorney, Agent, or Firm* — Chun-Ming Shih

(57) ABSTRACT

A semiconductor structure includes a substrate including a front side, a conductive bump disposed over the front side, and an opaque molding disposed over the front side and around a periphery portion of an outer surface of the conductive bump, wherein the opaque molding includes a recessed portion disposed above a portion of the front side adjacent to a corner of the substrate and extended through the opaque molding to expose the portion of the front side and an alignment feature disposed within the portion of the front side.

20 Claims, 12 Drawing Sheets

(56) References Cited

U.S. PATENT DOCUMENTS

| | | | | | |
|---|---|---|---|---|---|
| 2009/0283877 A1* | 11/2009 | Tsai | ................ | H01L 24/11 257/659 |
| 2013/0119527 A1* | 5/2013 | Luo | ................ | H01L 23/36 257/690 |
| 2013/0149841 A1* | 6/2013 | Indyk | ................ | H01L 24/29 438/462 |
| 2013/0187269 A1* | 7/2013 | Lin | ................ | H01L 21/565 257/737 |

* cited by examiner

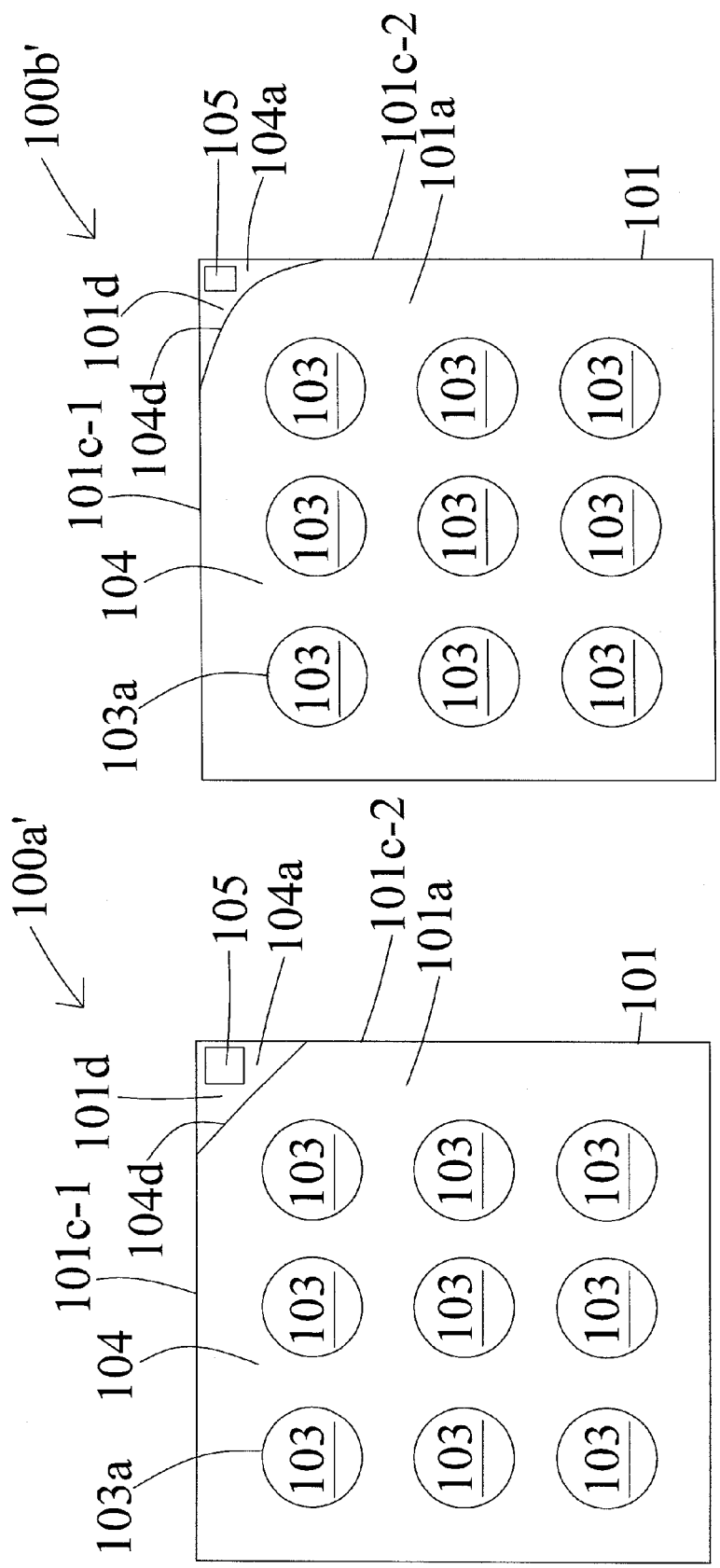

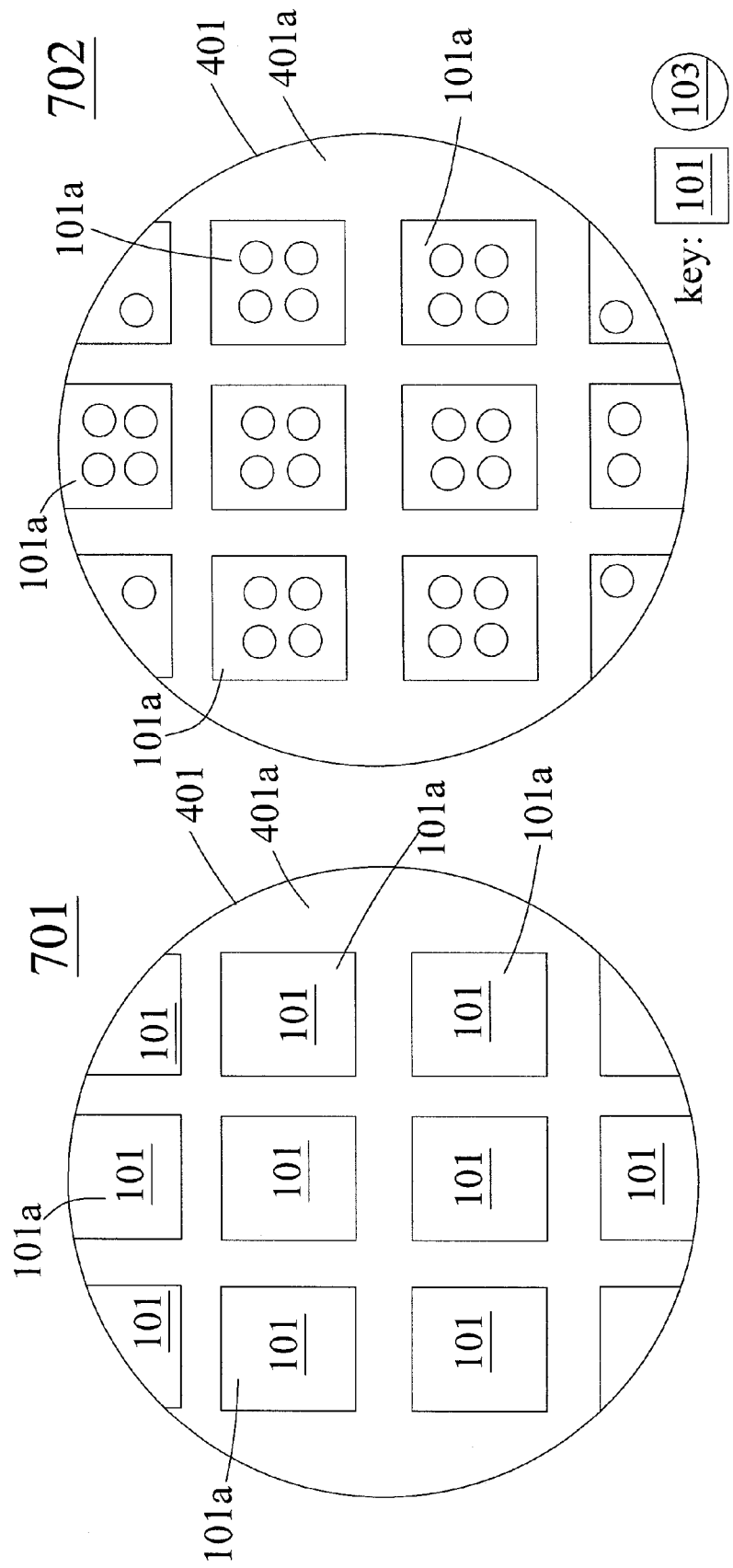

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor reliability of the electrical interconnection and a high yield loss of the semiconductor device. The semiconductor device is produced in a undesired configuration, which would further exacerbate materials wastage and thus increase the manufacturing cost. As such, there are many challenges for modifying a structure of the semiconductor devices and improving the manufacturing operations.

Thus, there is a continuous need to improve a structure and a manufacturing method for of the semiconductor device in order to solve the above deficiencies and minimize a yield loss of the assembled semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic view of a semiconductor structure with a recessed portion in a triangular shape in accordance with some embodiments.

FIG. 2B is a schematic view of a semiconductor structure with a recessed portion in a curved shape in accordance with some embodiments.

FIG. 7A is a schematic view of a semiconductor structure with several die areas in accordance with some embodiments.

FIG. 7B is a schematic view of a semiconductor structure with conductive bumps disposed over a substrate in accordance with some embodiments.

DETAILED DESCRIPTION OF THE DISCLOSURE

Figure 1:
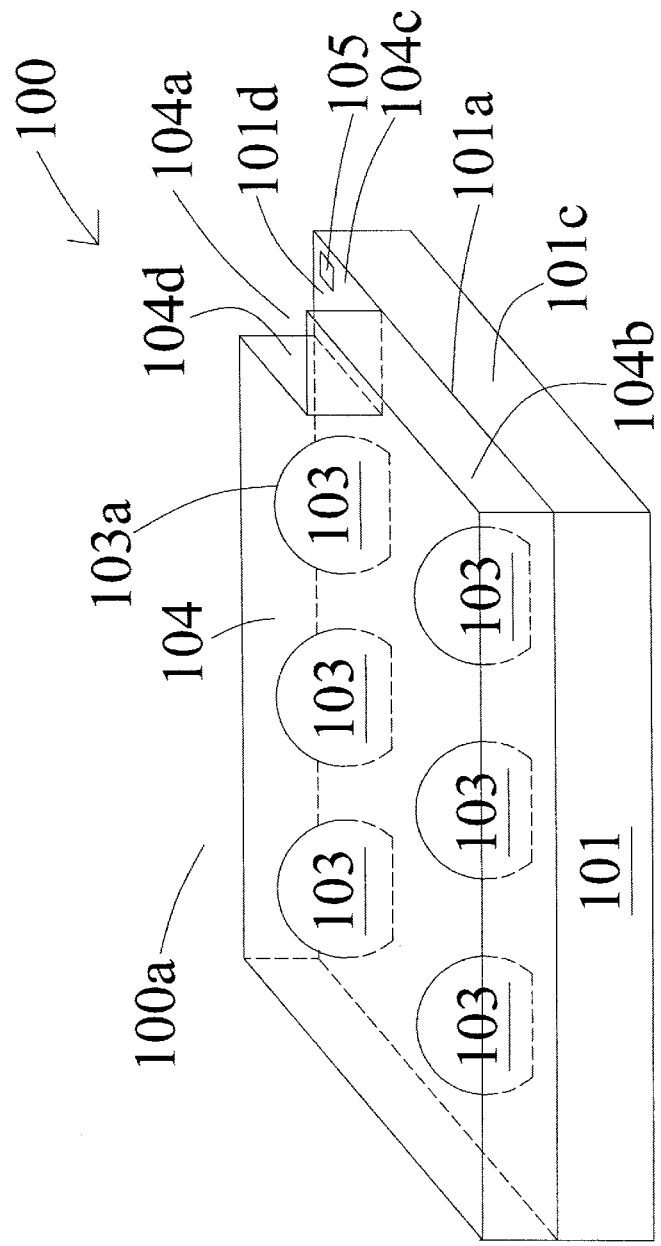
FIG. 1 is a schematic view of a semiconductor structure with a recessed portion of a molding in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor wafer includes numbers of die areas. Each die area has a mark formed at a corner or periphery of a front side of the die area to assist subsequent alignment and die sawing operations. Further, the wafer is divided by several scribe line regions, which are defined on a top surface of the wafer for facilitating the die sawing operations. Each of the scribe line regions is extended across the top surface of the wafer along either a horizontal or vertical direction to form a regular matrix layout. The die areas are aligned with each other in rows and columns and disposed on the top surface of the wafer within a predetermined area defined by the scribe line regions. After arrangement of the die areas on the wafer, numbers of conductive bumps are disposed on the front side of each die area, and a molding material is disposed over the whole wafer and covers the top surface of the wafer, the front side of the die area, the mark as well as the scribe lines.

However, the molding material disposed over the whole wafer is opaque and is not penetrable by light. As such, the scribe line regions defined on the top surface of the wafer and the mark on the front side of the die area are not visible through the molding material. It is undesirable for sawing the dies from the wafer without making any reference to the scribe line regions, the mark, a die area corner or a boundary of each die area for alignment and calibration upon the die sawing operations. The die could not be accurately sawn out from the wafer in accordance with the scribe line regions, and thus a reliability of each die would be decreased. Therefore, an accurate and precise die sawing operations could not be performed after disposing the opaque molding material over the wafer.

In the present disclosure, a semiconductor structure with a structural improvement is disclosed. The semiconductor structure includes a molding with numbers of recessed portions over a wafer for exposing some alignment features such as a mark on a front side of a die, a corner of the die or a segment of a scribe line region defined on the wafer. As the recessed portion of the molding passes through the molding, those alignment features would not be covered by the molding. As such, those alignment features are visible from a top of the wafer. With reference to those alignment features exposed from the molding, the wafer could be calibrated upon die sawing operations and the die could be sawn from the wafer accurately. Therefore, an accurate die sawing operations after disposing an opaque molding could be performed.

FIG. 1 is a semiconductor structure 100 in accordance with various embodiments of the present disclosure. FIG. 1 shows an isometric view of the semiconductor structure 100. In some embodiments, the semiconductor structure 100 is a die. In some embodiments, the semiconductor structure 100 includes a substrate 101, a conductive bump 103, a molding 104 and an alignment feature 105.

In some embodiments, the substrate 101 is a piece including semiconductor materials such as silicon and is fabricated with a predetermined functional circuit over the substrate 101 produced by various methods such as photolithography operations, etching or etc. In some embodiments, the substrate 101 is in a quadrilateral, a rectangular or a square shape.

In some embodiments, the substrate 101 includes a front side 101a. In some embodiments, the front side 101a is an active side of the substrate 101. In some embodiments, the front side 101a includes some conductive structures for electrically connecting with a circuitry external to the substrate 101. In some embodiments, the front side 101a is faced to a mounting surface of another die or another substrate. In some embodiments, the front side 101a includes post passivation interconnect (PPI) structure for electrically connecting the substrate with the external circuitry. In some embodiments, the PPI structure includes several conductive traces and several passivation layers stacking over the substrate 101. The conductive traces are extended along and passed through the passivation layers to connect the substrate 101 with the external circuit.

In some embodiments, a conductive bump 103 is disposed over the front side 101a of the substrate 101. In some embodiments, the conductive bump 103 is disposed on a conductive bond pad of the front side 101a. In some embodiments, several conductive bumps 103 are arranged on the front side 101a in a regular array.

In some embodiments, the conductive bump 103 is electrically connected with a the substrate 101 through some conductive structures. In some embodiments, the conductive bump 103 is disposed on the mounting surface of another die or another substrate, such that the circuitry of the semiconductor device 100 is electrically connected with a circuitry within another die or another substrate through the conductive bump 103.

In some embodiments, the conductive bump 103 is in a hemispherical shape as a solder ball. In some embodiments, the conductive bump 103 includes metals such as lead, tin copper, gold, nickel, etc. or metal alloy such as combination of lead, tin copper, gold, nickel, etc.

In some embodiments, a molding 104 is disposed over the front side 101a. In some embodiments, the molding 104 substantially covers the front side 101a. In some embodiments, the conductive bumps 103 are partially covered by the molding 104. A top portion of an outer surface 103a of the conductive bump 103 is exposed from the molding 104. In some embodiments, the conductive bumps are wholly covered by the molding 104. The outer surface 103a of the conductive bump 103 is invisible from the molding 104. In some embodiments, the molding 104 is protruded and extended from the front side 101a of the substrate 101. In some embodiments, a sidewall 104b of the molding 104 is substantially parallel and coplanar with a sidewall 101c of the substrate 101.

In some embodiments, the molding 104 has a high thermal conductivity, a low moisture absorption rate, a high flexural strength at board-mounting temperatures, or a combination of these. In some embodiments, the molding 104 includes polymeric material such as epoxy. In some embodiments, the molding 104 is opaque or is black in color. As such, the front side 101a of the substrate 101 and a periphery portion of the outer surface 103a of the conductive bump 103 are invisible from a top 100a of the semiconductor structure 100 (as shown in broken lines in FIG. 1).

In some embodiments, the molding 104 includes a recessed portion 104a disposed above a portion 101d of the front side 101a adjacent to a corner of the substrate 101. In some embodiments, the recessed portion 104a of the molding 104 is extended through the molding 104 to expose the portion 101d of the front side 101a.

In some embodiments, the portion 101d of the front side 101a exposed from the molding 104 is in a circular, quadrilateral or rectangular shape. In some embodiments, a cross section area of the recessed portion 104a from the top 100a is in a circular, quadrilateral or rectangular shape.

In some embodiments, the recessed portion 104a of the molding 104 includes a bottom 104c coplanar with the front side 101a of the substrate 101. In some embodiments, the bottom 104c of the recessed portion 104a is interfaced with the portion 101d of the front side 101a. The bottom 104c has a surface area substantially equal to a surface area of the portion 101d of the substrate 101. In some embodiments, the bottom 104c is in a circular, quadrilateral or rectangular shape.

In some embodiments, the recessed portion 104a of the molding 104 includes a sidewall 104d substantially orthogonal to the front side 101*a* of the substrate 101. The sidewall 104*d* is extended from the front side 101*a*. In some embodiments, the sidewall 104*d* has substantially same height as a thickness of the molding 104 from the front side 101*a* towards the top 100*a* of the semiconductor structure 100. In some embodiments, the sidewall 104*d* of the recessed portion 104*a* is passed across a portion of an outer surface 103*a* of the conductive bump 103. The portion of the outer surface 103*a* is protruded towards the recessed portion 104*a*.

In some embodiments, the alignment feature 105 is disposed at a corner of the front side 101*a* and exposed from the molding 104. In some embodiments, the alignment feature 105 is exposed by the recessed portion 104*a* of the molding, such that the alignment feature 105 is visible from the top 100*a* of the semiconductor structure 100. In some embodiment, the alignment feature 105 is in a rectangular, quadrilateral, polygonal or cross shape.

Figure 2:
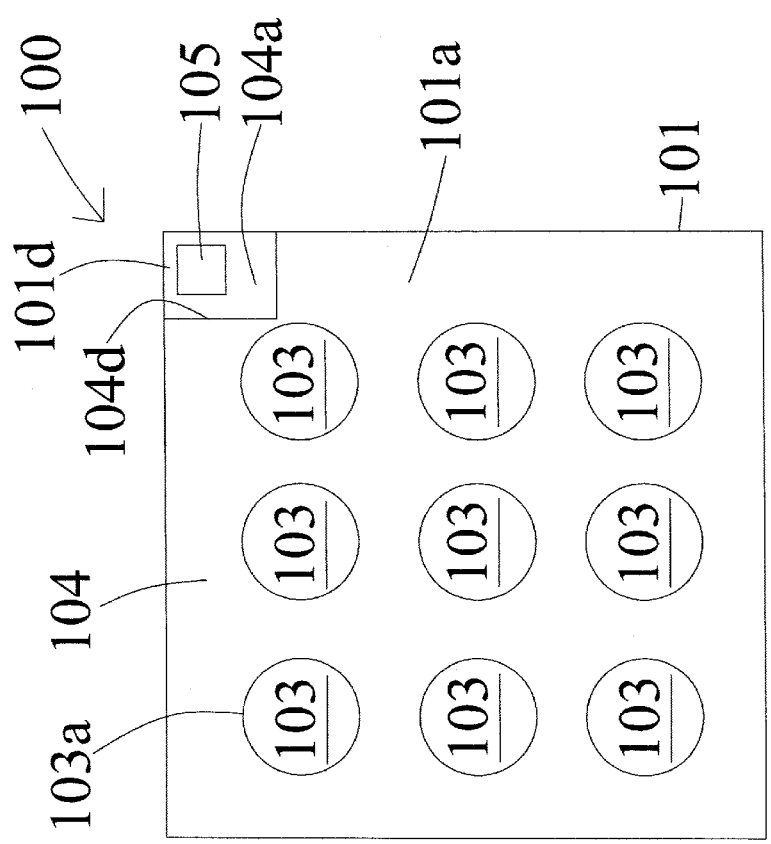
FIG. 2 is a top view of a semiconductor structure of FIG. 1 in accordance with some embodiments.

FIG. 2 is a top plan view of the semiconductor structure 100 of FIG. 1 in accordance with various embodiments of the present disclosure. In some embodiments, the semiconductor structure 100 includes the substrate 101, the conductive bump 103, the molding 104 and the alignment feature 105, which are in similar configuration as in FIG. 1.

In some embodiments, the periphery portion of the outer surface 103*a* of each conductive bump 103 and substantial portion of the front side 101*a* of the substrate 101 are covered by the molding 104 and thus are invisible. In some embodiments, a top portion of the outer surface 103*a* of each conductive bump 103 and a portion 101*d* of the front side 101*a* of the substrate 101 are exposed from the molding 104. In some embodiments, the portion 101*d* is exposed by the recessed portion 104*a* of the molding 104 and thus is visible. In some embodiments, the alignment feature 105 is not covered by the molding 104. The alignment feature 105 is exposed from the molding 104 by the recessed portion 104*a*.

FIG. 2A is a top plan view of a semiconductor structure 100*a*' in accordance with various embodiments of the present disclosure. The semiconductor structure 100*a*' includes the substrate 101, the conductive bump 103, the molding 104 and the alignment feature 105, which are in similar configuration as in FIG. 1.

In the embodiments, the recessed portion 104*a* of the molding 104 is in a triangular shape. In some embodiments, the recessed portion 104*a* includes the sidewall 104*d* diagonally disposed between two sidewalls (101*c*-1, 101*c*-2). In some embodiments, the alignment feature 105 is exposed from the molding 104 by the recessed portion 104, such that the alignment feature 105 is visible. In some embodiments, the portion 101*d* of the front side 101*a* of the substrate 101 exposed from the molding 104 is in a triangular shape.

FIG. 2B is a top plan view of a semiconductor structure 100*b*' in accordance with various embodiments of the present disclosure. The semiconductor structure 100*b*' includes the substrate 101, the conductive bump 103, the molding 104 and the alignment feature 105, which are in similar configuration as in FIG. 1.

In the embodiments, the recessed portion 104*a* includes the sidewall 104*d* in a curved shape. The sidewall 104*d* is curved from one sidewall 101*c*-1 to another sidewall 101*c*-2 of the substrate 101. In some embodiments, the alignment feature 105 is exposed from the molding 104 by the recessed portion 104.

Figures 3, 3A:
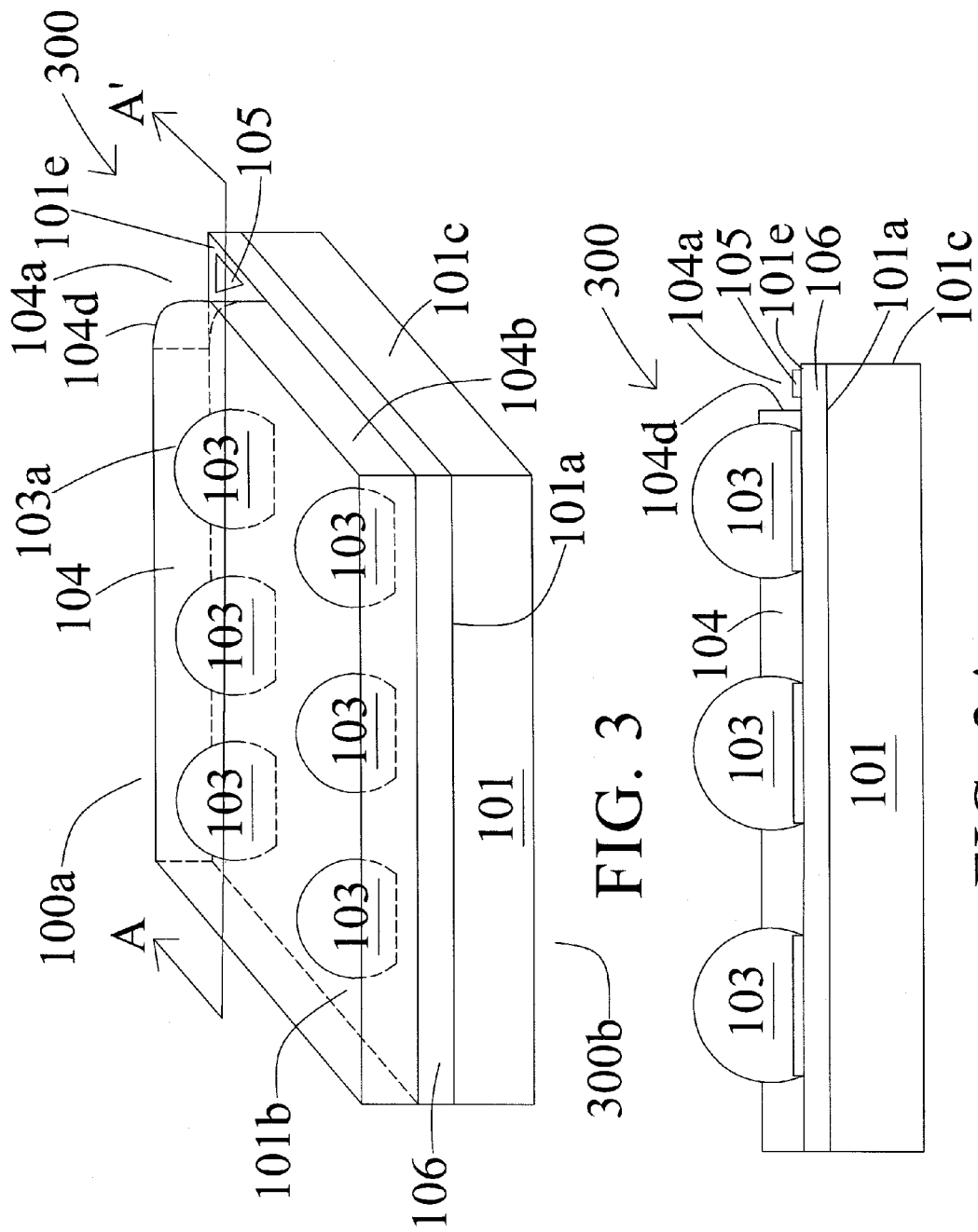
FIG. 3 is a schematic view of a semiconductor structure with a post passivation interconnect disposed on a substrate in accordance with some embodiments.
FIG. 3A is a cross section of a semiconductor structure of FIG. 3 along AA' in accordance with some embodiments.

FIG. 3 is a semiconductor structure 300 in accordance with various embodiments of the present disclosure. In some embodiments, the semiconductor structure 300 includes a substrate 101, a conductive bump 103, a post passivation interconnect (PPI) structure 106, an opaque molding 104 and an alignment mark 105. FIG. 3A is a cross section of the semiconductor structure 300 along AA'.

In some embodiments, the substrate 101 includes a front side 101*a*. In some embodiments, the front side 101*a* includes the PPI structure 106. In some embodiments, the PPI structure 106 includes some conductive structures for electrically connecting with a circuitry external to the substrate 101. In some embodiments, the PPI structure 106 includes several conductive traces routed from the substrate 101 and passed through several passivation layers towards the front side 101*a* of the substrate 101 to electrically connect with the conductive bump 103. In some embodiments, the PPI structure 106 passes through adjacent passivation layers by vias in order to connect the conductive bump 103 with the circuitry internal to the semiconductor structure 300. In some embodiments, the front side 101*a* is faced to a mounting surface of another substrate or another substrate.

In some embodiments, a conductive bump 103 is disposed over the front side 101*a* of the substrate 101. In some embodiments, the conductive bump 103 is disposed on a conductive bond pad of the front side 101*a*. In some embodiments, the conductive bump 103 is electrically connected with a circuitry of the PPI structure 106.

In some embodiments, the conductive bump 103 is disposed on the mounting surface of another substrate or another substrate, such that the circuitry of the PPI structure 106 is electrically connected with a circuitry within another substrate or another substrate through the conductive bump 103.

In some embodiments, the opaque molding 104 substantially covers the front side 101*a* of the substrate 101. In some embodiments, the opaque molding 104 is protruded from the front side 101*a* of the substrate 101. In some embodiments, the opaque molding 104 includes polymeric material such as epoxy. In some embodiments, the opaque molding 104 is black in color.

In some embodiments, a sidewall 104*b* of the opaque molding 104 is substantially parallel and coplanar with a sidewall 101*c* of the substrate 101. In some embodiments, a sidewall 104*d* of the opaque molding 104 is substantially orthogonal to the front side 101*a* of the substrate 101. In some embodiments, the sidewall 104*d* is in a curved shape.

In some embodiments, a corner 101*e* of the front side 101*a* of the substrate 101 is exposed from the opaque molding 104. The corner 101*e* is not covered by the opaque molding 104 and thus exposed. In some embodiments, the corner 101*e* is exposed from the opaque molding 104 by the recessed portion 104*a*. In some embodiments, an area of the corner 101*e* of the front side 101*a* of the substrate 101 exposed from the opaque molding 104 is about 10 mm$^2$ to about 50 mm$^2$. In some embodiments, the area of the corner 101*e* exposed from the opaque molding 104 is about 20 mm$^2$. In some embodiments, the area of the corner 101*e* of the front side 101*a* of the substrate 101 exposed from the opaque molding 104 is in a triangular, quadrilateral or polygonal shape.

In some embodiments, the alignment mark 105 is disposed at the corner 101*e* of the front side 101*a* of the substrate 101 and is exposed from the opaque molding 104. The alignment mark 105 is not covered by the opaque molding 104, so that the alignment mark 105 is exposed and visible. In some embodiments, the alignment mark 105 is configured for aligning the substrate 101 during fabrication of the semiconductor structure 300 and sawing the semiconductor structure 300 from a wafer. In some embodiments, the alignment mark 105 is in a rectangular, quadrilateral, triangular, cross or polygonal shape. In some embodiments, the alignment mark 105 is a part of a seal ring embedded in the PPI structure 106. In some embodiments, the part of the seal ring underneath the corner 101e is visible from the recessed portion 104a of the opaque molding 104.

Figure 4:
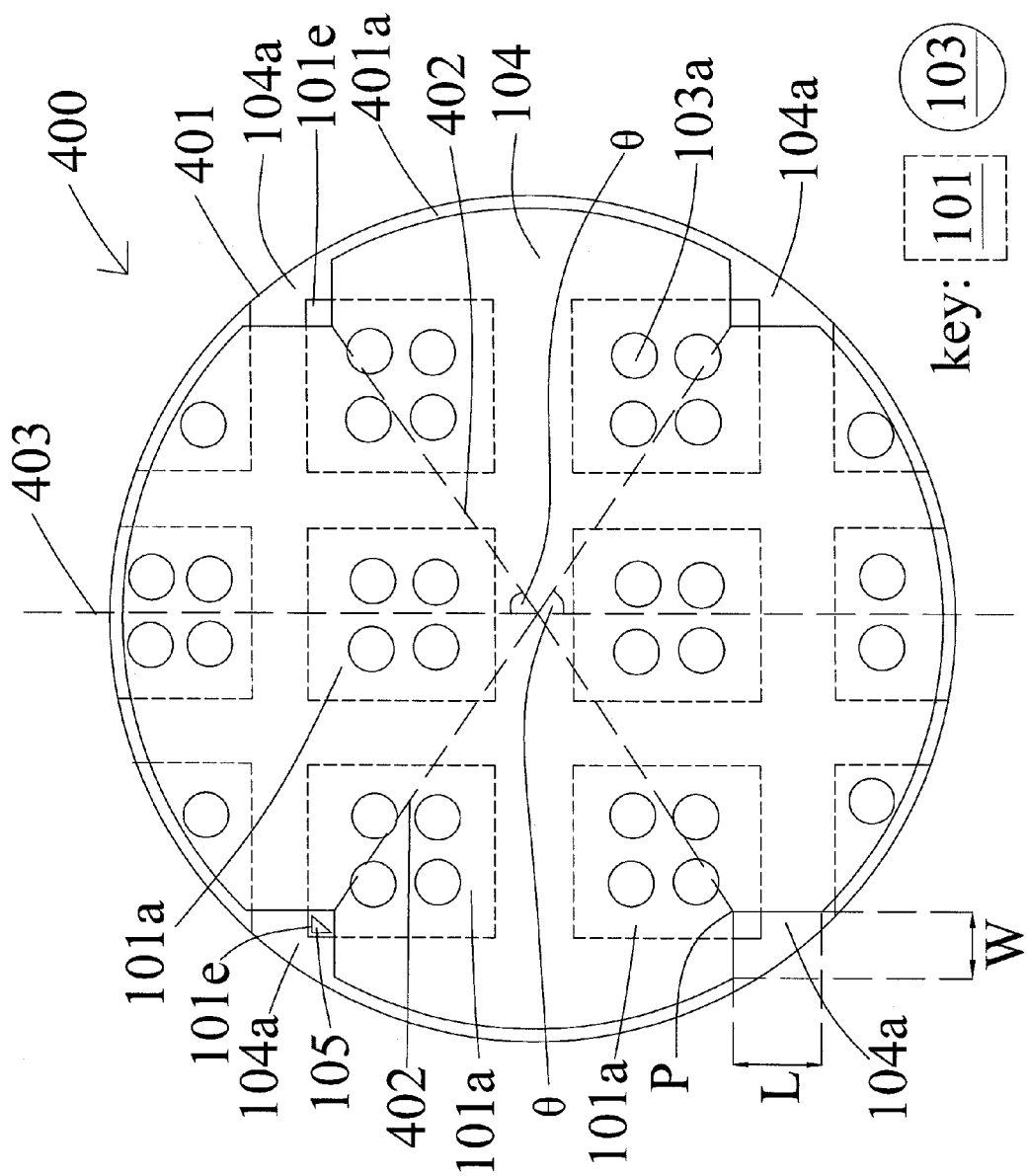
FIG. 4 is a schematic view of a semiconductor structure with an angled diagonal axis passing through a recessed portion in accordance with some embodiments.

FIG. 4 is a semiconductor structure 400 in accordance with various embodiments of the present disclosure. FIG. 4 shows a top view of the semiconductor structure 400. In some embodiments, the semiconductor structure 400 includes a wafer 401. The wafer 401 includes several die areas 101. In some embodiments, PPI structure, conductive bumps 103 and a molding 104 are disposed over each die area 101 during fabrication. In some embodiments, the molding 104 substantially covers die areas 101. In some embodiments, several recessed portions 104a are disposed at a predetermined position of the wafer 401.

In some embodiments, the wafer 401 includes semiconductor materials such as silicon. In some embodiments, the wafer 401 is in a circular, quadrilateral or polygonal shape. In some embodiments, the wafer 401 has a width or diameter of about 150 mm to 500 mm. In some embodiments, the diameter of the wafer 401 is about 300 mm.

In some embodiments, the die areas 101 are defined on a top surface 401a of the wafer 401. In some embodiments, the die areas 101 are arranged in an array on the top surface 401a. In some embodiments, the die areas 101 are aligned with each other horizontally and vertically.

In some embodiments, several conductive bumps 103 are disposed over each die area 101. In some embodiments, the conductive bumps 103 are disposed on a front side 101a of each die area 101. In some embodiments, the conductive bump 103 is configured for electrically connecting a circuitry within the corresponding die area 101 with a circuitry within another die or another substrate.

In some embodiments, the molding 104 is disposed over the top surface 401a of the wafer 401 and the front sides 101a of the die areas 101. In some embodiments, the molding 104 is opaque or in a black color, so that the top surface 401a and the front sides 101a103 are substantially covered by the molding 104 and thus invisible from a top of the wafer 401. In some embodiments, periphery portion of an outer surface 103a of each conductive bump 103 is covered by the molding 104.

In some embodiments, the molding 104 is offset from a periphery of the wafer 401. In some embodiments, the molding 104 is in a circular shape which is similar to the shape of the wafer 401. In some embodiments, the molding 104 is offset from the periphery of the wafer 401 in a distance of about 3 mm to about 8 mm. In some embodiments, the distance is about 5 mm.

In some embodiments, the molding 104 includes several recessed portions 104a disposed at predetermined positions of the wafer 401, so that predetermined portions of the top surface 401a are exposed from the molding 104. In some embodiments, the recessed portion 104a is disposed at the predetermined position of the top surface 401a adjacent to the periphery of the wafer 401, such that a corresponding predetermined portion of the top surface 401a and the corner 101 e of the die area 101 are exposed from the molding 104. In some embodiments, the recessed portions 104a are respectively disposed adjacent to the corners 101e nearest to the periphery of the wafer 401, so that the corners 101e nearest to the periphery of the wafer 401 are exposed from the molding 104. The corners 101e of the die areas 101 are visible from the top of the wafer 401.

In some embodiments, the recessed portion 104a of the molding 104 is in a triangular or quadrilateral shape. In some embodiments, an area of the predetermined portion of the top surface 401a exposed from the molding 104 by the recessed portion 104a is about 40 mm² to about 100 mm². In some embodiments, the recessed portion 104a has a length L of about 8 mm to 15 mm. In some embodiments, the length L is about 12 mm. In some embodiments, the recessed portion 104a has a width W of about 5 mm to about 10 mm. In some embodiments, the width W is about 8 mm.

In some embodiments, the recessed portion 104a is disposed at the predetermined position of the wafer 401 defined by an angle θ between a central axis 403 of the wafer 401 and a diagonal axis 402 across the wafer 401. In some embodiments, the central axis 403 passes through a center of the wafer 401. In some embodiments, the diagonal axis 402 is angled with the central axis 403 in the angle θ. In some embodiments, the angle θ is about 50° to 60°. In some embodiments, the angle θ is about 55°. In some embodiments, the recessed portion 104a is disposed at the predetermined position of the wafer 401 along the diagonal axis 402 and adjacent to the periphery of the wafer 401. In some embodiments, an intersecting point P of the length L and the width W of the recessed portion 104a is passed through by the diagonal axis 402.

In some embodiments, an alignment feature 105 is disposed at the corner 101e of the substrate 101. In some embodiments, the alignment feature 105 is disposed within the predetermined portion of the top surface 401a exposed from the molding 104 by the recessed portion 104a, so that the alignment feature 105 is exposed from the molding 104 and is visible from the top of the wafer 401. In some embodiments, the alignment feature 105 is in a triangular, rectangular, quadrilateral, cross or polygonal shape.

Figure 5:
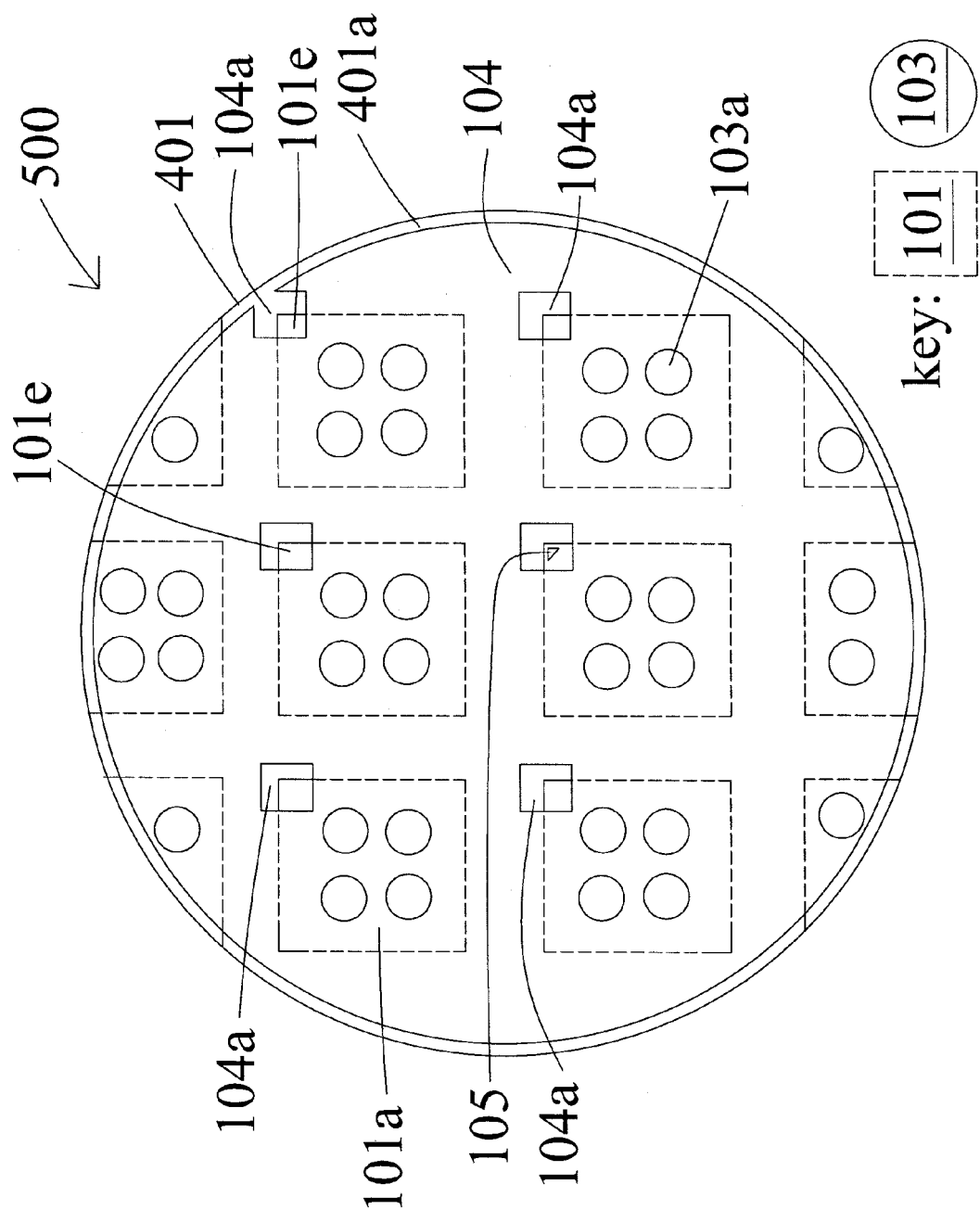
FIG. 5 is a schematic view of a semiconductor structure with recessed portions aligned with each other in accordance with some embodiments.

FIG. 5 is a semiconductor structure 500 in accordance with various embodiments of the present disclosure. FIG. 5 shows a top view of the semiconductor structure 500. In some embodiments, the semiconductor structure 500 includes a wafer 401, several die areas 101, several conductive bumps 103 and a molding 104 covering the die areas 101 and the periphery portions of the outer surfaces 103a of the conductive bumps 103, which are in similar configuration as in FIG. 4.

In some embodiments, several recessed portions 104a are disposed at predetermined positions of the molding 104, such that predetermined corners 101e of the die areas 101 are exposed from the molding 104. In some embodiments, the recessed portions 104a of the molding 104 are respectively disposed above the predetermined corners 101e of the die areas 101 and aligned with each other horizontally and vertically. In some embodiments, the recessed portions 104a are arranged in a regular array over the top surface 401a of the wafer 401.

In some embodiments, each of the recessed portion 104a exposes the predetermined portion of the top surface 401a and the predetermined corner 101e of the die area 101 from the molding 104, so that the predetermined portion of the top surface 401a and the predetermined corner 101e are visible from the top of the wafer 401. In some embodiments, an alignment feature 105 is disposed on the front side 101a of the die area 101 and is exposed from the molding 104 by the recessed portion 104a.

In some embodiments, the recessed portion 104a is in a rectangular shape. In some embodiments, each die area 101 has at least one corner 101e exposed from the molding 104 by the recessed portion 104a. In some embodiments, each of about 80% of die areas 101 on the wafer 401 has at least one corner 101e exposed from the molding 104. In some embodiments, each of at least about 20% of die areas 101 on the wafer 401 has at least one corner 101e exposed from the molding 104.

Figure 6:
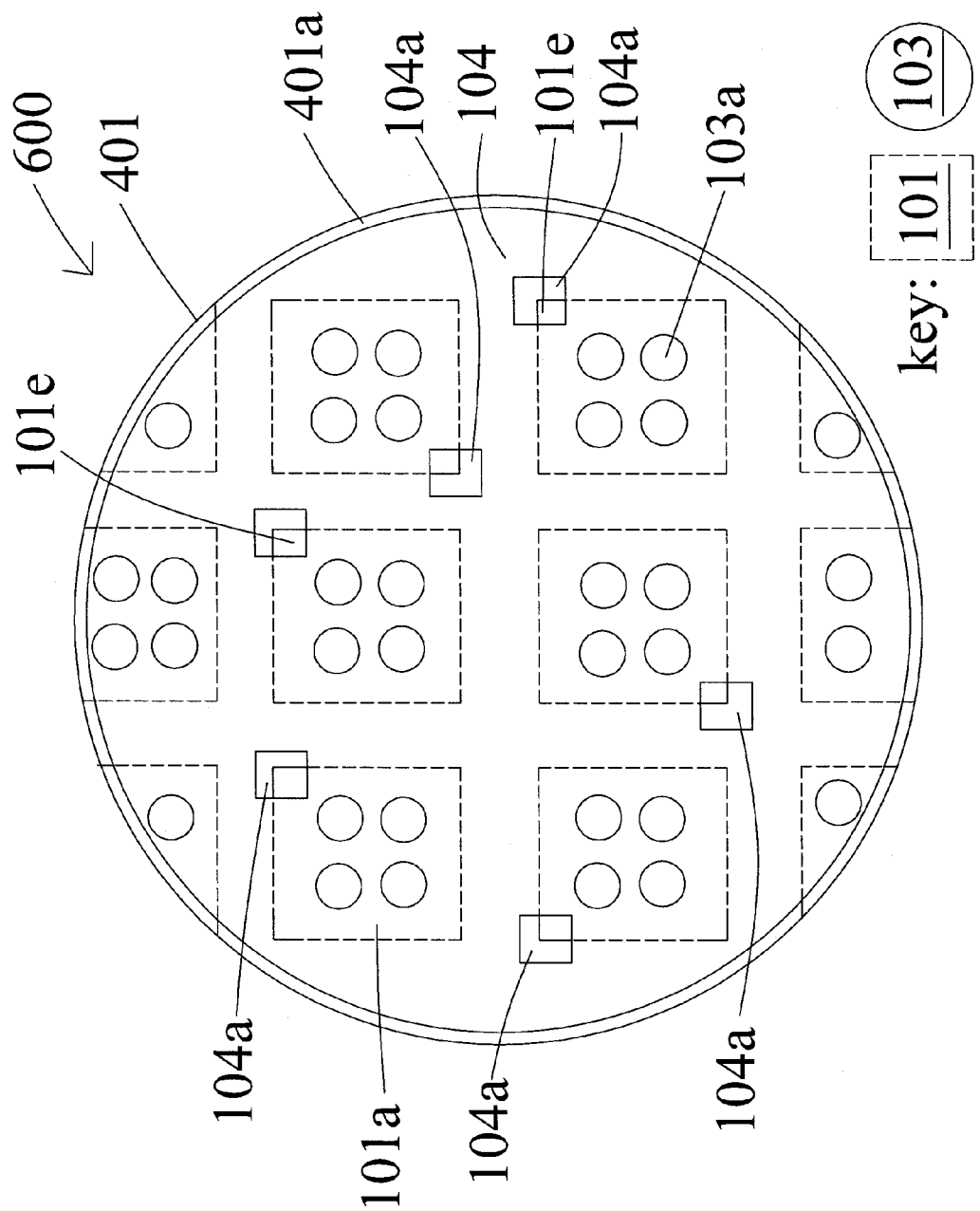
FIG. 6 is a schematic view of a semiconductor structure with recessed portions disposed at predetermined positions of a molding in accordance with some embodiments.

FIG. 6 is a semiconductor structure 600 in accordance with various embodiments of the present disclosure. FIG. 6 shows a top view of the semiconductor structure 600. In some embodiments, the semiconductor structure 600 includes a wafer 401, several die areas 101, several conductive bumps 103 and a molding 104 covering the die areas 101 and the periphery portions of the outer surfaces 103a of the conductive bumps 103, which are in similar configuration as in FIG. 4.

In some embodiments, several recessed portions 104a are disposed at predetermined positions of the molding 104, such that predetermined corners 101e of the die areas 101 are exposed from the molding 104. In some embodiments, the recessed portions 104a of the molding 104 are randomly or irregularly disposed above the corners 101e of the die areas 101 respectively. In some embodiments, a predetermined number of recessed portions 104a are disposed over the wafer 401, such that the predetermined number of corners 101e of die areas 101 are exposed from the molding 104.

Figure 7:
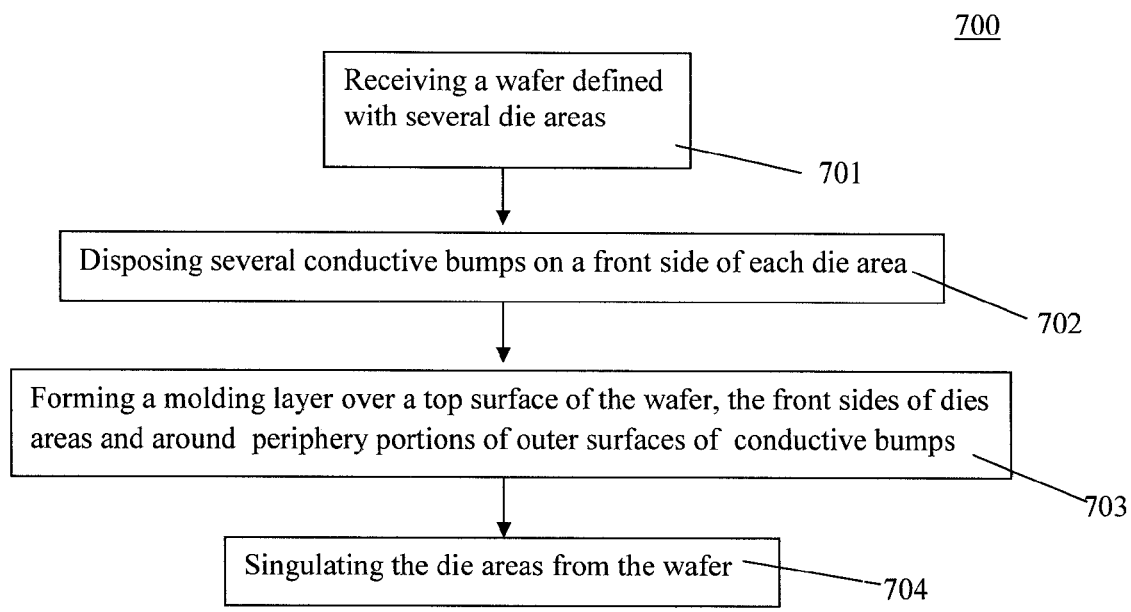
FIG. 7 is a flow diagram of a method of manufacturing a semiconductor structure in accordance with some embodiments.

FIG. 7 is a flowchart of a method 700 of manufacturing a semiconductor structure in accordance with various embodiments of the present disclosure. In some embodiments, the method 700 manufactures the semiconductor structure similar to the semiconductor structure 100 as in FIG. 1. The method 700 includes a number of operations (701, 702, 703 and 704).

In operation 701, several die areas 101 are defined on a wafer 401 as in FIG. 7A. In some embodiments, the die areas 101 are arranged in an array and aligned with each other in rows and columns. In some embodiments, the die areas 101 are defined on a top surface 401a of the wafer 401. In some embodiments, each die area 101 includes a front side 101a. In some embodiments, the front side 101a is configured for disposing a conductive structure.

In operation 702, several conductive bumps 103 are disposed over the front side 101a of each die area 101 as in FIG. 7B. In some embodiments, the conductive bumps 103 are arranged on each front side 101a in an array. In some embodiments, the conductive bump 103 has similar configuration as in FIG. 1.

Figures 7C, 7D:
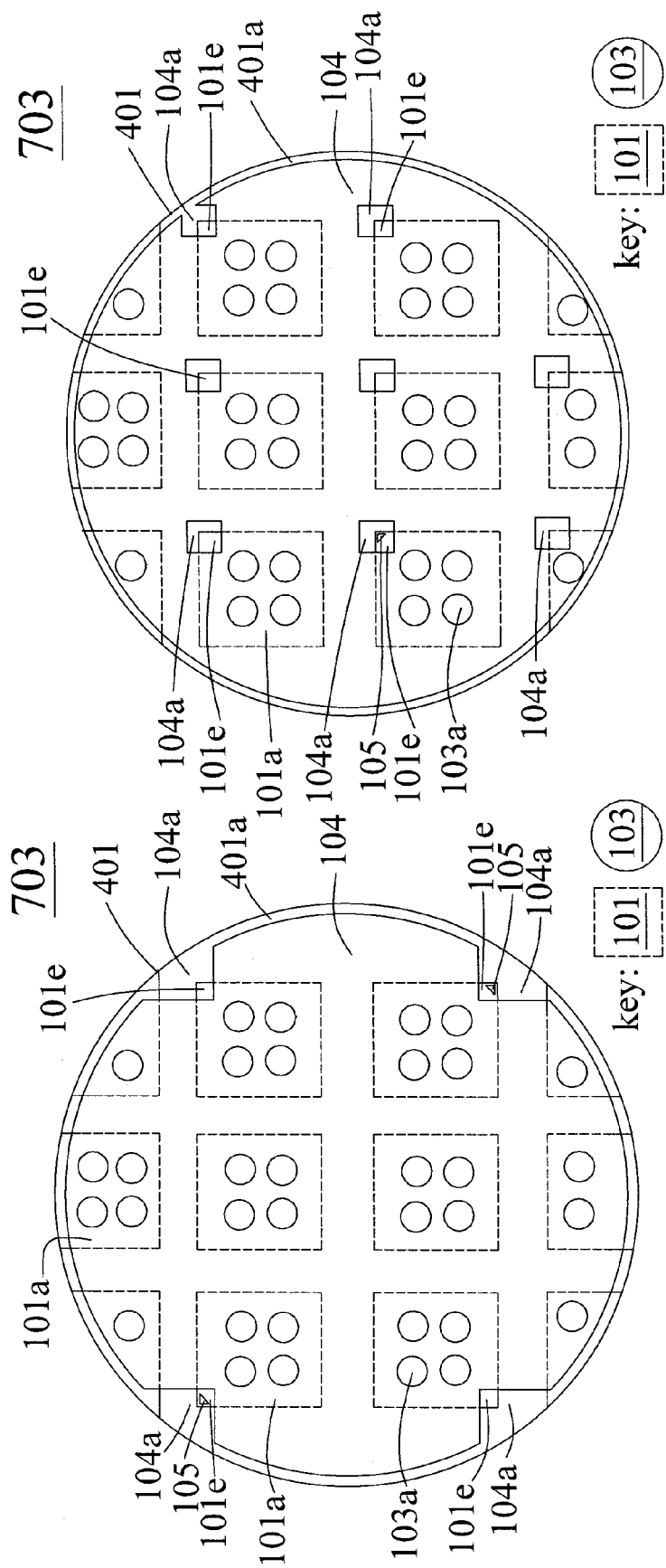
FIG. 7C is a schematic view of a semiconductor structure with a molding including a recessed portion disposed adjacent to a periphery of a wafer in accordance with some embodiments.
FIG. 7D is a schematic view of a semiconductor structure with a molding including a recessed portion aligned with each other in accordance with some embodiments.

In operation 703, a molding layer 104 is formed over the front sides 101a of the die areas 101 and the periphery portions of the outer surfaces 103a of the conductive bumps 103 as in FIG. 7C. In some embodiments, the molding layer 104 is formed by disposing a molding material over the top surface 401a of the wafer 401, the front sides 101a of the die areas 101 and the conductive bumps 103. The top surface 401a, the front sides 101a and the conductive bumps 103 are covered by the molding layer 104. In some embodiments, the molding material includes epoxy which is opaque and is black in color. In some embodiments, the molding layer 104 is opaque or is black in color.

In some embodiments, the molding layer 104 is formed by transfer molding or any other suitable operations. In some embodiments, the molding layer 104 is formed by encapsulating the wafer 401 with an upper mold chase and a lower mold chase complementary to the upper mold chase and then filling the molding material between the upper mold chase and the lower mold chase. In some embodiments, the molding material fills a cavity defined by the upper mold chase and the lower mold chase, then the molding layer 104 is formed after curing operation.

In some embodiments, the molding layer 104 includes several recessed portions 104a for exposing predetermined portions of the top surface 401a of the wafer 401 or predetermined portions of the front sides 101a of the die areas 101. In some embodiments, the recessed portions 104a are disposed adjacent to a periphery of the wafer 401.

In some embodiments, the recessed portions 104a are disposed above predetermined corners 101e of the die areas 101. In some embodiments, the predetermined corners 101e exposed from the molding layer 104 include one of the corners 101e of about 20% to about 100% (all) of the die areas 101. In some embodiments, one of the corners 101e of about 80% of the die areas 101 are exposed from the molding layer 104.

In some embodiments, the recessed portion 104a of the molding layer 104 is configured for exposing predetermined corners 101e of the die areas 101 from the molding layer 104, so that the predetermined corners 101e are visible from top of the wafer 401.

In some embodiments, the recessed portions 104a are formed by several protrusions disposed on and extended from the upper mold chase or the lower mold chase complementary to the upper mold chase. In some embodiments, the protrusions are disposed adjacent to the periphery of the wafer 401 and above the predetermined corners 101e of the die areas 101 when the wafer 401 is encapsulated within the cavity of the upper mold chase and the lower mold chase. The protrusions are protruded from the upper mold chase or the lower mold chase towards the front sides 101a of the die areas 101.

In some embodiments, the recessed portions 104a expose several alignment marks 105 disposed on the predetermined corners 101e respectively. In some embodiments, the alignment mark 105 is disposed within the predetermined portion of the top surface 401a or predetermined portion of the front side 101a, so that the alignment mark 105 is exposed from the molding layer 104 and is visible.

In some embodiments, the recessed portions 104a are arranged in an array and aligned with each other horizontally and vertically as in FIG. 7D. In some embodiments, the recessed portions 104a are disposed at predetermined positions of the molding layer 104 and above predetermined corners 101e of the die areas 101 and predetermined portions of the top surface 401a of the wafer 401.

In some embodiments, all upper right corners of the die areas 101 are exposed from the molding layer 104 by the recessed portions 104a and are visible. In some embodiments, the protrusions protruded from the upper or lower mold chase are disposed above the upper right corner of each die area 101 to form the recessed portions 104a exposing all upper right corners of the die areas 101.

Figures 7E, 7F:
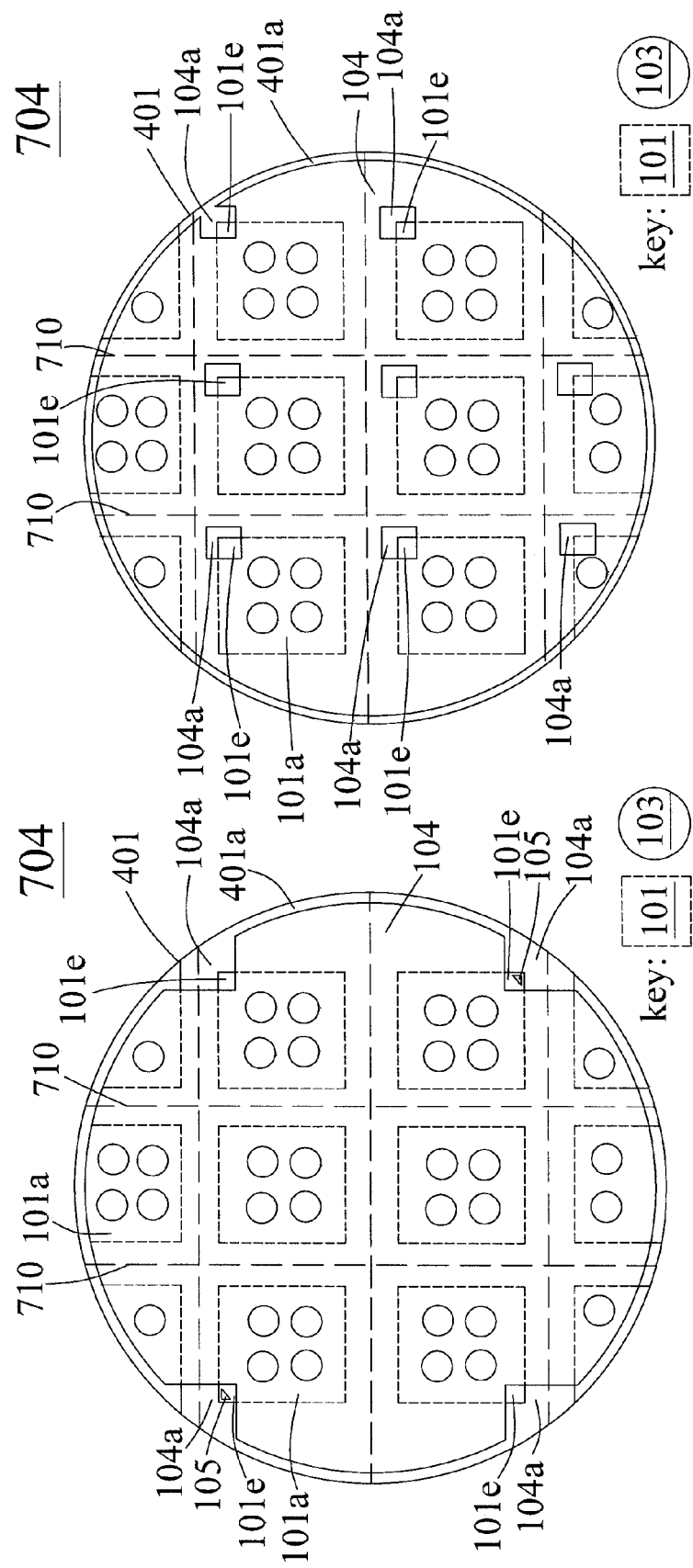
FIG. 7E is a schematic view of a semiconductor structure with scribe line regions for die singulation in accordance with some embodiments.
FIG. 7F is a schematic view of a semiconductor structure with scribe line region for die singulation in accordance with some embodiments.

In operation 704, each die areas 101 defined on the wafer 401 is sawn from the wafer 401 as in FIG. 7E and FIG. 7F. In some embodiments, the wafer 401 in FIG. 7C is sawn as in FIG. 7E, and the wafer 401 in FIG. 7D is sawn as in FIG. 7F.

Figure 7G:
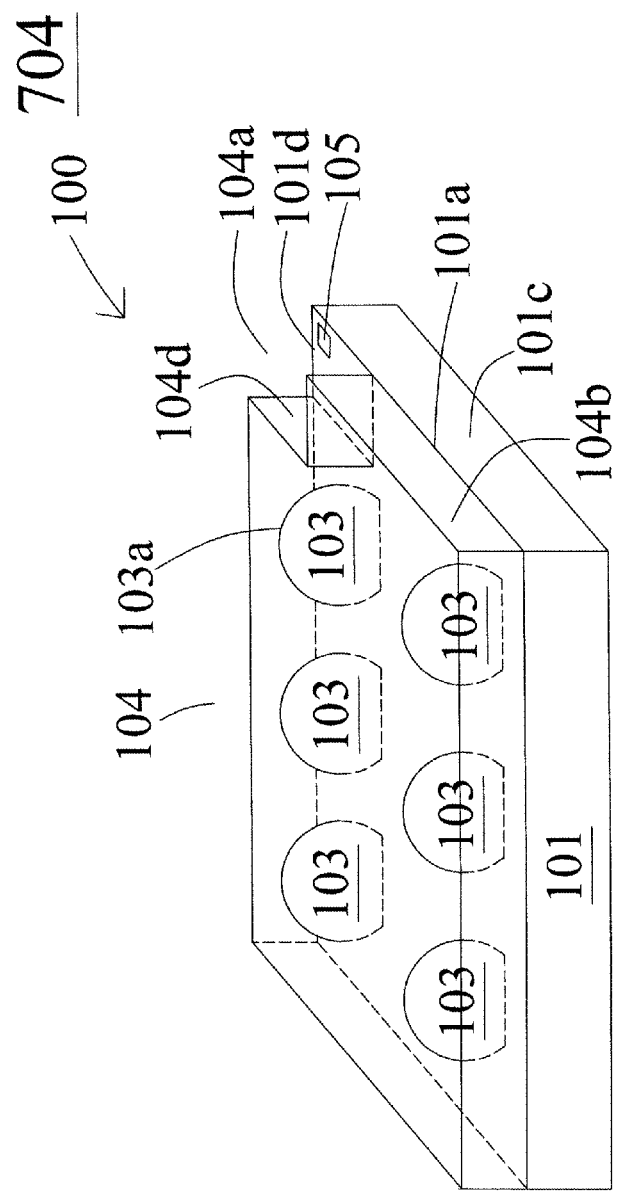
FIG. 7G is a schematic view of a semiconductor structure singulated from a wafer in accordance with some embodiments.

In some embodiments, the wafer 401 is aligned based on the exposed corners 101e of the die areas 101 or exposed portions of the top surface 401a of the wafer 401 or the alignment marks 105 exposed from the molding layer 104, then each die area 101 is sawn and singulated from the wafer 401 in accordance with several scribe line regions 701 defined on the wafer 401. The predetermined portions of the top surface 401, the predetermined corners 101e of the die areas 101 and the alignment marks 105 exposed from the opaque molding layer 104 facilitate alignment and sawing of the wafer 401, such that the die areas 101 can be singulated from the wafer 401 accurately and precisely. In some embodiments, several semiconductor structures 100 in FIG. 7G are produced by sawing the wafer 401 in FIG. 7E and FIG. 7F. In some embodiments, the semiconductor structure 100 in FIG. 7G has similar configuration as the semiconductor structure 100 in FIG. 1.

In the present disclosure, a semiconductor structure includes a molding with numbers of recessed portions over a wafer for exposing some alignment features such as a corner of a die area or an alignment mark disposed on a front side of a die area. Those alignment features are exposed from an opaque molding. As such, those alignment features are visible from a top of the wafer. With reference to those exposed alignment features, the wafer could be calibrated upon die sawing operations and the die areas could be sawn from the wafer accurately. Therefore, an accurate die sawing operations after disposing an opaque molding could be performed.

In some embodiments, a semiconductor structure includes a substrate including a front side, a conductive bump disposed over the front side and an opaque molding disposed over the front side and around a periphery portion of an outer surface of the conductive bump, wherein the opaque molding includes a recessed portion disposed above a portion of the front side adjacent to a corner of the substrate and extended through the opaque molding to expose the portion of the front side and an alignment feature disposed within the portion of the front side.

In some embodiments, the recessed portion of the opaque molding exposes the front side. In some embodiments, the recessed portion of the opaque molding includes a sidewall substantially orthogonal to the front side. In some embodiments, the alignment feature is disposed at a corner of the front side and exposed from the opaque molding.

In some embodiments, the recessed portion has a length of about 8 mm to 15 mm and a width of about 5 mm to about 10 mm. In some embodiments, the opaque molding includes an epoxy or is in black color. In some embodiments, the portion of the front side exposed from the opaque molding is in a triangular, a quadrilateral or polygonal shape.

In some embodiments, a semiconductor structure includes a substrate including a front side, a plurality of conductive bumps disposed over the front side of the substrate, a post passivation interconnect structure including a plurality of conductive traces routed within the front side of the substrate to electrically connect with the plurality of conductive bumps and an opaque molding substantially covering the front side of the substrate, wherein a corner of the front side of the substrate is exposed from the opaque molding.

In some embodiments, an alignment mark is disposed at the corner of the front side of the substrate and is exposed from the opaque molding. In some embodiments, the opaque molding exposes a top portion of an outer surface of each of the plurality of conductive bumps. In some embodiments, an area of the corner of the front side of the substrate exposed from the opaque molding is about 10 mm² to about 50 mm².

In some embodiments, an area of the corner of the front side of the substrate exposed from the opaque molding is in a triangular, a quadrilateral or a polygonal shape. In some embodiments, the corner is an upper right corner of the substrate.

In some embodiments, a method of manufacturing a semiconductor structure includes receiving a wafer defined with a plurality of die areas thereon disposing a plurality of conductive bumps over a front side of each of the plurality of die areas, forming an opaque molding layer over the front sides of the plurality of die areas and around periphery portions of outer surfaces of the plurality of conductive bumps, wherein the opaque molding layer includes a plurality of recessed portions for exposing predetermined corners of the plurality of die areas from the opaque molding layer.

In some embodiments, the forming the opaque molding layer includes encapsulating the wafer by an upper mold chase and a lower mold chase complementary to the upper mold chase, and filling an opaque molding material between the upper mold chase and the lower mold chase. In some embodiments, the plurality of recessed portions expose alignment marks disposed on the predetermined corners respectively.

In some embodiments, the plurality of recessed portions are formed by a plurality of protrusions disposed on and extended from an upper mold chase or a lower mold chase complementary to the upper mold chase. In some embodiments, the predetermined corners are one corner of each of about 20% to about 100% of the plurality of die areas. In some embodiments, further comprising sawing each of the plurality of die areas from the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate including a front side;
    a conductive bump disposed over the front side; and
    an opaque molding disposed over the front side and exposing a portion of an outer surface of the conductive bump,
    wherein the opaque molding includes a recessed portion disposed above a portion of the front side adjacent to a corner of the substrate, extended through the opaque molding and exposing the portion of the front side and an alignment feature disposed within the portion of the front side from the opaque molding, the recessed portion includes a height substantially same as a thickness of the opaque molding exposing the portion of the outer surface of the conductive bump.

2. The semiconductor structure of claim 1, wherein the recessed portion of the opaque molding exposes the front side.

3. The semiconductor structure of claim 1, wherein the recessed portion of the opaque molding includes a sidewall substantially orthogonal to the front side.

4. The semiconductor structure of claim 1, wherein the alignment feature is disposed at a corner of the front side and exposed from the opaque molding.

5. The semiconductor structure of claim 1, wherein the recessed portion has a length of about 8 mm to 15 mm and a width of about 5 mm to about 10 mm.

6. The semiconductor structure of claim 1, wherein the opaque molding includes an epoxy or is in black color.

7. The semiconductor structure of claim 1, wherein the portion of the front side exposed from the opaque molding is in a triangular, a quadrilateral or polygonal shape.

8. A semiconductor structure, comprising:
a substrate including a front side;
a plurality of conductive bumps disposed over the front side of the substrate;
a post passivation interconnect structure including a plurality of conductive traces routed within the front side of the substrate to electrically connect with the plurality of conductive bumps; and
an opaque molding substantially covering the front side of the substrate and partially covering the plurality of conductive bumps,
wherein the opaque molding includes a recessed portion exposing an alignment feature disposed at a corner of the front side of the substrate from the opaque molding, and the recessed portion includes a height substantially same as a thickness of the opaque molding partially covering the plurality of conductive bumps.

9. The semiconductor structure of claim 8, wherein the recess portion is disposed above the alignment mark.

10. The semiconductor structure of claim 8, wherein the opaque molding exposes a top portion of an outer surface of each of the plurality of conductive bumps.

11. The semiconductor structure of claim 8, wherein an area of the corner of the front side of the substrate exposed from the opaque molding is about 10 mm$^2$ to about 50 mm$^2$.

12. The semiconductor structure of claim 8, wherein an area of the corner of the front side of the substrate exposed from the opaque molding is in a triangular, a quadrilateral or a polygonal shape.

13. The semiconductor structure of claim 8, wherein the corner is an upper right corner of the substrate.

14. A semiconductor structure, comprising:
a substrate including a front side;
a conductive bump disposed over the front side; and
an opaque molding disposed over the front side and surrounding the conductive bump,
wherein the opaque molding includes a recessed portion extended through the opaque molding and exposing an alignment feature disposed over the front side, the recessed portion includes a height substantially same as a thickness of the opaque molding exposing a portion of the conductive bump.

15. The semiconductor structure of claim 14, wherein the opaque molding is protruded and extended from the front side of the substrate.

16. The semiconductor structure of claim 14, wherein the recessed portion of the opaque molding includes a bottom coplanar with the front side of the substrate.

17. The semiconductor structure of claim 14, wherein the recessed portion of the opaque molding includes a bottom interfaced with the portion of the front side of the substrate.

18. The semiconductor structure of claim 14, wherein the alignment feature is a portion of the front side of the substrate or a corner of the front side of the substrate.

19. The semiconductor structure of claim 14, wherein the alignment feature is visible from a top of the semiconductor structure.

20. The semiconductor structure of claim 14, wherein the recessed portion of the opaque molding includes a sidewall in a curved shape curving between two sidewalls of the substrate.

* * * * *